(12) United States Patent
Park et al.

(10) Patent No.: US 6,667,906 B2
(45) Date of Patent: *Dec. 23, 2003

(54) INTEGRATED CIRCUIT HAVING AN EEPROM AND FLASH EPROM USING A MEMORY CELL WITH SOURCE-SIDE PROGRAMMING

(75) Inventors: Eungjoon Park, Fremont, CA (US); Ali Pourkeramati, Redwood City, CA (US)

(73) Assignee: Azalea Microelectronics Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/100,508

(22) Filed: Mar. 14, 2002

(65) Prior Publication Data

US 2002/0172075 A1 Nov. 21, 2002

Related U.S. Application Data

(63) Continuation-in-part of application No. 09/938,266, filed on Aug. 23, 2001, now Pat. No. 6,584,016, which is a continuation-in-part of application No. 09/757,088, filed on Jan. 8, 2001, now Pat. No. 6,416,556.

(51) Int. Cl.[7] .............................................. G11C 11/34
(52) U.S. Cl. ................................ 365/185.18; 365/185.24
(58) Field of Search ........................ 365/185.18, 185.24

(56) References Cited

U.S. PATENT DOCUMENTS

| | | | | |
|---|---|---|---|---|
| 5,687,115 A | * | 11/1997 | Wong et al. | 365/185.03 |
| 6,416,556 B1 | * | 7/2002 | Park | 365/185.28 |
| 6,501,684 B1 | * | 12/2002 | Park et al. | 365/185.33 |

* cited by examiner

*Primary Examiner*—M. Tran
(74) *Attorney, Agent, or Firm*—Townsend and Townsend and Crew, LLP

(57) ABSTRACT

In accordance with one embodiment of the present invention, a non-volatile integrated circuit memory includes a flash EPROM array having a first plurality of memory cells, and an EEPROM array having a second plurality of memory cells arranged along rows and columns. Each of the first and second plurality of memory cells has a drain region spaced apart from a source region to form a channel region therebetween. The drain region has a greater depth than the source region. Each memory cell further has a floating gate and a select gate. The EEPROM array further includes a plurality of data lines each being coupled to the drain regions of a plurality of cells along at least a portion of a column of cells, and a plurality of source lines each being coupled to the source regions of a plurality of cells along at least a portion of a row of cells.

36 Claims, 10 Drawing Sheets

| Mode | Selected WL | Unselected WL | Selected DL | Unselected DL | Selected SL | Unselected SL | Selected Bulk | Unselected Bulk |
|---|---|---|---|---|---|---|---|---|
| Erase | -10V | Vss | 5V | Float | Float | Float | Vss | Vss |
| Erase VF | VH1 | Vss | 0.7V | Float | Vss | Float | Vss | Vss |
| Program | 5V | -5V | -5V | Float | Vss | Float | -5V | Vss |
| Program VF | VH2 | Vss | 0.7V | Float | Vss | Float | Vss | Vss |
| Read | Vcc | Vss | 0.7V | Float | Vss | Float | Vss | Vss |

FIG. 6A

| Mode | Selected WL | Unselected WL | Selected DL | Unselected DL | Selected SL | Unselected SL | Selected Bulk | Unselected Bulk |
|---|---|---|---|---|---|---|---|---|
| Erase | -10V | Vss | 5V | Float | Float | Float | Vss | Vss |
| Erase VF | VH1 | Vss | 0.7V | Float | Vss | Float | Vss | Vss |
| Program | 10V | Vss | Vss | Float | 5V | Float | Vss | Vss |
| Program VF | VH2 | Vss | 0.7V | Float | Vss | Float | Vss | Vss |
| Read | Vcc | Vss | 0.7V | Float | Vss | Float | Vss | Vss |

FIG. 6B

| Mode | Selected Row0 | Un-selected Row1 | Selected Gwl0 | Un-selected Gwl1 | Vss | VVss | Selected Sel0 | Selected Sel0 | Un-selected Sel1 | Un-selected Sel1 | Selected BI00 | Selected BI07 | Un-selected BI10 | Un-selected BI17 | Bulk |
|---|---|---|---|---|---|---|---|---|---|---|---|---|---|---|---|
| Erase | 10V | 0V | -10V | 0V | 0V | F | -10V | 0V | 0V | -10V | 0V/5V (1) | 0V/5V (1) | 0V | 0V | 0V |
| Program | 5V | -5V | 5V | 0V | 0V | 0V | 0V | 5V | 5V | 0V | -5V/F (2) | -5V/F (2) | F | F | -5V |
| Read | 3V | 0V | 3V | 3V | 0V | 0V | 0V | 3V | 3V | 0V | 1V | 1V | 0V | 0V | 0V |

(1) 0V for already erased bit; 5V for bits to be erased
(2) F(float) for bit to remain erased; -5V for bit to be programmed

*FIG. 8A*

| Mode | Selected Row0 | Un-selected Row1 | Selected Gwl0 | Un-selected Gwl1 | Vss | VVss | Selected Sel0 | Selected $\overline{Sel0}$ | Un-selected Sel1 | Un-selected $\overline{Sel1}$ | Selected Bl00 | Selected Bl07 | Un-selected Bl10 | Un-selected Bl17 | Bulk |
|---|---|---|---|---|---|---|---|---|---|---|---|---|---|---|---|
| Erase | 10V | 0V | -10V | 0V | 0V | F | -10V | 0V | 0V | -10V | 0V/5V (1) | 0V/5V (1) | 0V | 0V | 0V |
| Program | 10V | 0V | 10V | 0V | 0V | 5V | 0V | 5V | 5V | 0V | 0V/F (2) | 0V/F (2) | F | F | 0V |
| Read | 3V | 0V | 3V | 3V | 0V | 0V | 0V | 3V | 3V | 0V | 1V | 1V | 0V | 0V | 0V |

(1) 0V for already erased bit; 5V for bits to be erased
(2) F(float) for bit to remain erased; 0V for bit to be programmed

FIG. 8B

INTEGRATED CIRCUIT HAVING AN EEPROM AND FLASH EPROM USING A MEMORY CELL WITH SOURCE-SIDE PROGRAMMING

CROSS-REFERENCES TO RELATED APPLICATIONS

This application is a continuation-in-part of U.S. application Ser. No. 09/938,266 filed Aug. 23, 2001, now U.S. Pat. No. 6,584,016, which is a continuation-in-part of U.S. application Ser. No. 09/757,088 filed Jan. 8, 2001, now U.S. Pat. No. 6,416,556, which disclosures are incorporated herein by reference.

BACKGROUND OF THE INVENTION

The most common variety of non-volatile memories, such as EPROM, flash memory, and some EEPROMs, today employs channel hot electron (CHE) for programming and negative gated Fowler-Nordheim (FN) tunneling for erase. FIG. 1 shows a conventional n-channel stack gate flash memory cell 100. Memory cell 100 includes N+ source 102 and drain 103 regions spaced apart in a P-type silicon substrate 101 to form a channel region 104 therebetween. A floating gate 105 of polycrystalline silicon material is laid on top of a tunneling dielectric 106, which extends over the channel region 104 and overlaps the source 102 and drain 103 regions. Stacked on top of, but insulated from, floating gate 105 is a gate 107 of polycrystalline material. Junction 102 is made deeper than normal in order to minimize the adverse reliability effects of tunnel oxide hot hole trapping during erase operation.

Cell 100 is programmed, i.e., its threshold voltage is raised higher, by applying 10V to gate 107, 5V to drain 103, and grounding source 102. The memory cell is thus strongly turned on, and the cell's threshold voltage is raised due to injection of hot electrons from the channel region near the drain 103 to floating gate 106, as indicated by the arrow labeled as "P". Cell 100 is erased, i.e., its threshold voltage is lowered, by applying −10V to gate 107, 5V to source 102, and floating drain 103. The cell's threshold voltage is thus lowered due to tunneling of electrons from the floating gate 105 to source 102, as indicated by the arrow labeled as "E".

Conventional memory arrays include a matrix of memory cells arranged along rows and columns. The gates of the cells along each row are connected together forming a wordline. In one array architecture, the cells along each column are grouped in a number of segments, and the drains of the cells in each segment are coupled to a corresponding segment line. The segment lines along each column are coupled to a corresponding data line through one or more segment select transistors. The segmentation of the cells in each column helps reduce the bitline capacitance to that of the metal bitline plus the small capacitance of a selected segment line. Performance of the memory is thus improved.

During programming or read operations, one or more bitlines are selected through a column select circuit for transferring data to or from the selected memory cells. The column select circuit typically has a multiplexer configuration in that a group of serially-connected NMOS pass transistors controlled by column decoding signals selectively couple one or more bitlines to either sense amplifiers (read operation) or data-in buffers (programming operation). Depending on the total number of bitlines in the array and the number of bitlines to be selected, two or more levels of column selection need to be implemented in the column select circuit. The number of levels of column selection corresponds to the number of serially-connected pass transistors that couple the selected bitlines to the sense amplifier or data-in buffer. For example, if two levels of column selection are implemented, a selected bitline will be coupled to the sense amplifier or data-in buffer through two serially-connected column select transistors.

The sizes of the column select transistors and the segment select transistors need to be made large enough so that the required cell programming voltage and current can be provided to the selected cell. Because of the programming biasing conditions, the serially connected segment select transistor and column select transistors result in a rather resistive path, which can be compensated for by increasing the transistor sizes. This can be more clearly understood with the help of FIG. 2.

FIG. 2 shows a portion 201 of an array along with a portion 202 of a column select circuit. The array portion 201 includes a memory cell 100 with its gate coupled to wordline WL and its drain coupled to a segment line S0. The source of cell 100 is shown as being connected to ground for simplicity, although, the source is typically connected to a source line which may be decoded to provide ground only to selected memory cells. A segment select transistor MS is coupled between segment line S0 and bitline BL, with its gate coupled to segment select signal SS. Bit line BL is coupled to the data-in block 204 through two serially connected column select transistors MYa and MYb. Column select transistors MYa and MYb are controlled by column decode signals Ya and Yb, respectively. As indicated in FIG. 2, the deeper source junction 102 of the FIG. 1 cell is connected to ground, while the shallower drain junction 103 is connected to segment line S0.

As can be seen, cell 100, and transistors MS, MYa, and MYb are serially-connected to data-in block 204. To program cell 100, 10V is supplied to wordline WL, while 5V needs to be supplied to its drain, i.e., to segment line S0. To supply 5V to segment line S0, data-in block 204 outputs 5V on line 206, and column select signals Ya and Yb as well as segment select signal SS are raised to 10V. Thus, the 5V on line 206 is transferred through transistors MYa, MYb, and MS to segment line S0. The drive capability of each transistor MYa, MYb, MS is, to a first order approximation, equal to its Vgs−Vt, wherein Vgs represents the transistor gate to source voltage, and Vt represents the transistor threshold voltage. For each of transistors MYa, MYb, MS, Vgs=Vg−Vs=10V−5V=5V, and the Vt is approximately 2V because of the back bias effect. Thus, for each transistor MYa, MYb, MS, Vgs−Vt=5V−2V=3V. Because of the small Vgs−Vt of 3V, the sizes of these transistors need to be made large so that sufficient current can be supplied to the cell during programming.

In higher density memories, where the number of levels in the column select circuit increases, the sizes of the column select transistors increase proportionally. This increases the die size. More importantly, as higher performance is required of memory devices, the need for further segmentation of the bitlines increases, resulting in a larger number of segment select transistors in the array. The adverse impact of a larger size segment select transistor and a larger number of segment select transistors on the overall die size can be rather substantial.

FIG. 3 illustrates another draw back of conventional memory arrays, namely, the non-uniform programming characteristic of memory cells in the array due to the source resistance. A portion 300 of a memory array is shown as including 16 memory cells 100-0 to 100-15 along a row. The drain of each cell is coupled to a corresponding segment line S0 to S15, and the gates of the cells are connected to a wordline WL. The sources of the cells are connected together and to metal source lines SLn and SLn+1 through a diffusion strip 310. Resistors R0 to R16 depict the resistance associated with the diffusion strip 310. The cell configuration of FIG. 3 is repeated as many times as required to form the entire array.

For the above-indicated cell biasing during programming, the cell programming performance is dependent primarily upon the gate to source voltage Vgs of the cell. For example, with the wordline WL at 10V, and the source fully grounded, the cell Vgs equals a full 10V. However, because of the presence of the resistive diffusion strip 310, depending on the location of the cells along the diffusion strip 310, the effective Vgs of the cells vary. For example, of the 16 cells, the cells closest to the center of the diffusion strip will have the maximum source resistance, and thus poorer programming characteristics, while the cells closest to the ends of the diffusion strip 310 have minimum source resistance, and thus the best programming characteristics. This leads to the undesirable non-uniform programming characteristics of the cells across the array.

An electrically erasable programmable read only memory (EEPROM) device typically includes arrays of EEPROM cells arranged in rows and columns. In an EEPROM device, each group of memory cells forming a data byte (e.g., eight memory cells) is individually accessible and thus can be programmed and erased independent of the other data bytes. A conventional EEPROM cell includes a tunnel oxide through which electrons tunnel (a process commonly referred to as Fowler-Nordheim (FN) tunneling) during both programming and erase operations. Furthermore, in an EEPROM device, each memory cell has a dedicated select transistor.

A flash electrically programmable read only memory (EPROM) device typically includes arrays of flash EPROM cells arranged in rows and columns. In a flash EPROM device, erase operation is typically performed on a sector-by-sector basis, each sector including a block of cells, e.g., one or more rows or columns of cells. Therefore, all memory cells disposed in a sector are erased at once. Alternatively, if a flash EPROM array is not divided into sectors, all the flash EPROM cells disposed within the memory device are erased at once. A conventional flash EPROM cell uses hot electron injection for programming and FN tunneling for erase operations.

Flash EPROM and EEPROM devices are often used in different applications. Generally, because of its smaller size, a flash EPROM device is less expensive than an EEPROM device having the same storage capacity and is thus more widely used, for example, in mass data storage applications where reprogrammability occurs less frequently. However, where byte-by-byte reconfigurability and non-volatility is a requirement, EEPROM devices are typically used.

With the rapid growth of the battery operated portable electronic devices, there has been a parallel increase in demand for non-volatile memory devices such as EEPROMs and flash EPROMs within the same portable device. Cellular phones, for example, commonly include both types of memory devices, with the EEPROM typically storing the user reconfigurable information and the flash EPROM typically storing operating algorithms or other types of data.

The ever increasing market demands for more compact and low power electronic devices has made it desirable to combine these two types of memory arrays on the same integrated circuit housed within the same package. However, combining these two types of memories in the same integrated circuit in an efficient manner and such that each memory type maintains its flexibility (e.g., byte erasable EEPROM) has been difficult because of the divergent requirements of the flash EPROM and EEPROM cell technologies.

Thus, an array architecture and method of operation are needed so that flash EPROM and EEPROM can be easily integrated in the same integrated circuit while the adverse effect of column select and segment select transistor sizes on the die size can be minimized and a more uniform programming characteristic across the array cells can be obtained.

SUMMARY

In accordance with one embodiment of the present invention, a non-volatile integrated circuit memory includes a flash EPROM array having a first plurality of memory cells, and an EEPROM array having a second plurality of memory cells arranged along rows and columns. Each of the first and second plurality of memory cells has a drain region spaced apart from a source region to form a channel region therebetween. The drain region has a greater depth than the source region. Each memory cell further has a floating gate and a select gate. The EEPROM array further includes a plurality of data lines each being coupled to the drain regions of a plurality of cells along at least a portion of a column of cells, and a plurality of source lines each being coupled to the source regions of a plurality of cells along at least a portion of a row of cells.

In accordance with another embodiment of the present invention, a non-volatile integrated memory includes a flash EPROM array having a first plurality of memory cells, and an EEPROM array having a second plurality of memory cells arranged along rows and columns. The EEPROM array further includes a plurality of data lines each being coupled to a drain region of a plurality of cells along at least a portion of a column of cells, and a plurality of source lines each being coupled to a source region of a plurality of cells along at least a portion of a row of cells, each memory cell having a gate terminal, a floating gate, and a channel region between its source and drain regions. One or more of the first and second plurality of memory cells are biased so that a threshold voltage of the one or more biased memory cells is increased by channel hot electron injection from a portion of the channel region substantially near the source region to the floating gate.

In accordance with another embodiment of the present invention, a method of operating a non-volatile integrated circuit memory having an EEPROM array and a flash EPROM array includes: accessing a memory cell in the EEPROM array having a plurality of memory cells arranged along rows and columns, each memory cell having a drain region, a source region, a gate terminal, a floating gate, and a channel region between its source and drain regions, the EEPROM array further having a plurality of data lines each being coupled to a drain region of each of a plurality of memory cells along a column, and a plurality of source lines each being coupled to a source region of each of a plurality of memory cells along a row; and providing a voltage representing the data to be programmed in the accessed memory cell on a preselected data line coupled to the accessed cell, wherein a threshold voltage of the accessed memory cell is increased by injection of hot electrons from a portion of the selected cell's channel region substantially near the source region to the accessed cell's floating gate.

These and other embodiments of the present invention, as well as its advantages and features are described in more detail in conjunction with the text below and attached figures.

BRIEF DESCRIPTION OF THE DRAWINGS

FIGS. 6A and 6B exemplify, in a table format, two sets of biasing conditions applied to the memory array in FIG. 1 during each of the program, erase, and read operations

FIGS. 8A and 8B exemplify, in a table format, two sets of biasing conditions applied to the EEPROM array of FIG. 1 during each of the program, erase, and read operations.

DETAILED DESCRIPTION

Figure 4:
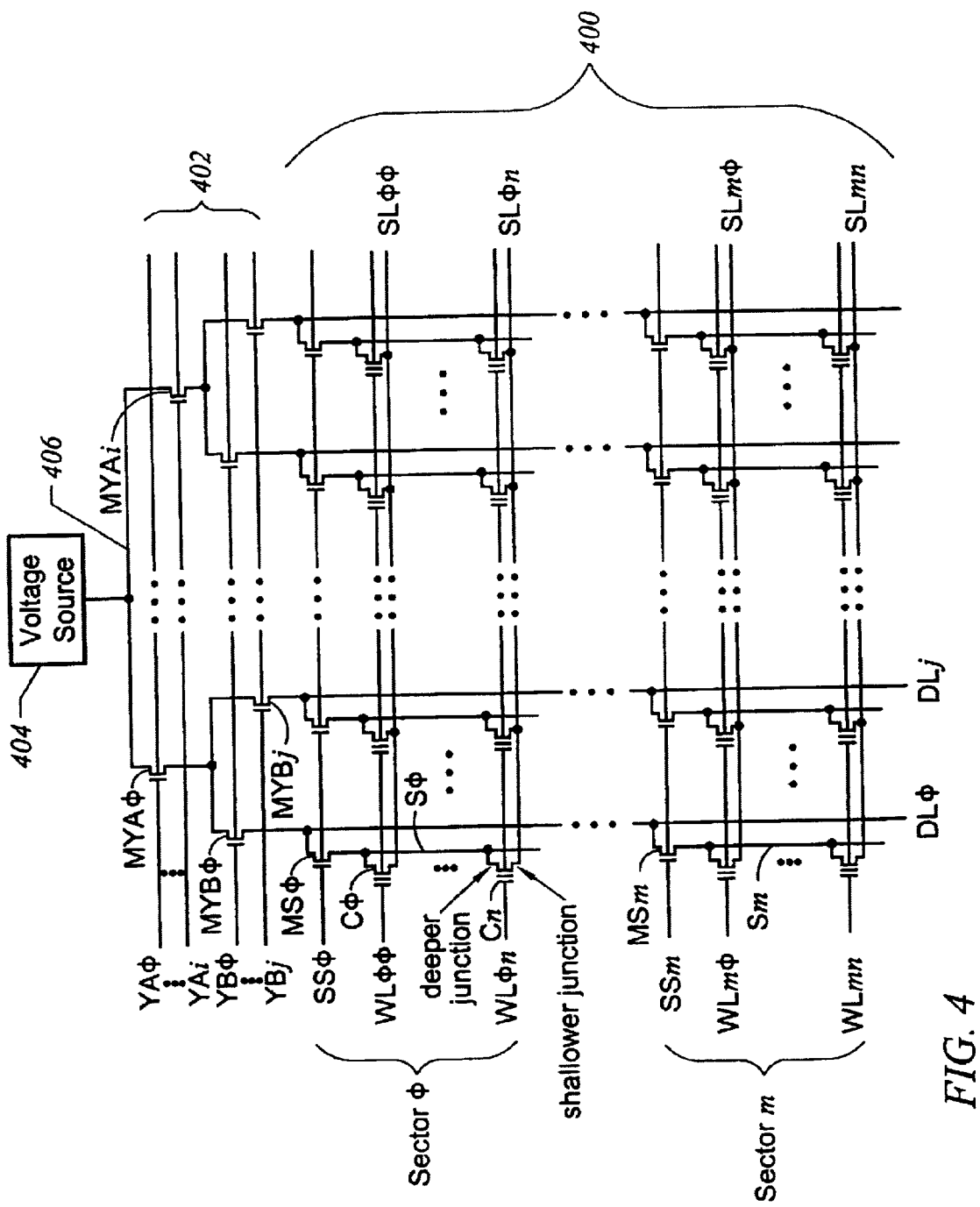
FIG. 4 is a simplified diagram of a memory array and an associated column selection circuit in accordance with one embodiment of the present invention.

FIG. 4 is a simplified diagram of a memory array 400 and an associated column selection circuit 402. Array 400 includes a matrix of non-volatile memory cells arranged along rows and columns. The gates of the cells along each row are connected to a wordline, e.g., the cells along the top row are connected to wordline WL00. The sources of the cells along each row are coupled to a corresponding source line SL extending parallel to the wordlines. For example the sources of the cells along the top row are connected to source line SL00.

The cells along each column are grouped in a number of segments, wherein the drains of the cells in each segment are coupled together through a corresponding segment interconnect. For example, the drains of cells C0–Cn are connected together though segment interconnect S0. The segment interconnects along each column are coupled to corresponding data lines DL through one or more segment select transistors. For example, segment interconnects S0 to Sm along one column are coupled to DL0 through the respective MS0 to MSn transistors, as shown. The segment select transistors MS are controlled by segment select signals on segment select lines SS0 to SSm. Segment select signals are decoded such that during a read or a programming operation only one of the segment select signals is raised high. As such only the row of segments in which the selected cell resides are coupled to the corresponding DL lines in a read or programming operation.

Data lines are coupled to a voltage source 404 (e.g., a charge pump circuit or an externally provided power supply) through the column select circuit 402. Voltage source 404 supplies the required programming and erase voltages to line 406 for transfer to the selected data lines DL. Line 406 is also connected to other circuitry such as sense amplifier and data-in buffer, not shown. Two levels of column selection are show in FIG. 1, although more or less levels may be used depending on the total number of bitlines in the array. The first level of decoding includes two or more sets of column select transistors MYB0 to MYBj for selecting a data line from each group of data lines DL0 to DLj. The second level of decoding includes transistors MYA0 to MYAi for selecting one of i+1 preselected data lines.

The cells coupled to each row of segment interconnects form a sector, as shown by sectors 0 to m in FIG. 4. In one embodiment, the cells in each sector are formed in a bulk region (not shown) which can be biased independently from each of the other sector bulk regions. Note that this sector configuration is intended to be illustrative and not limiting. Clearly, other sector configurations may be arranged depending on the design goals and technology limitations, as is well known to those skilled in this art.

Figure 1:
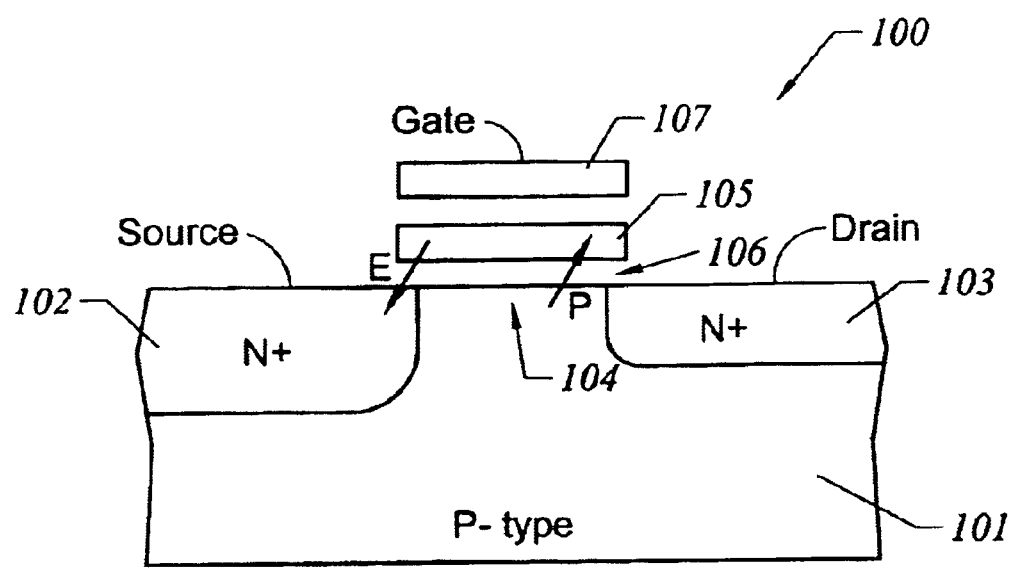
FIG. 1 shows a conventional n-channel stack gate flash memory cell.
Figure 2:
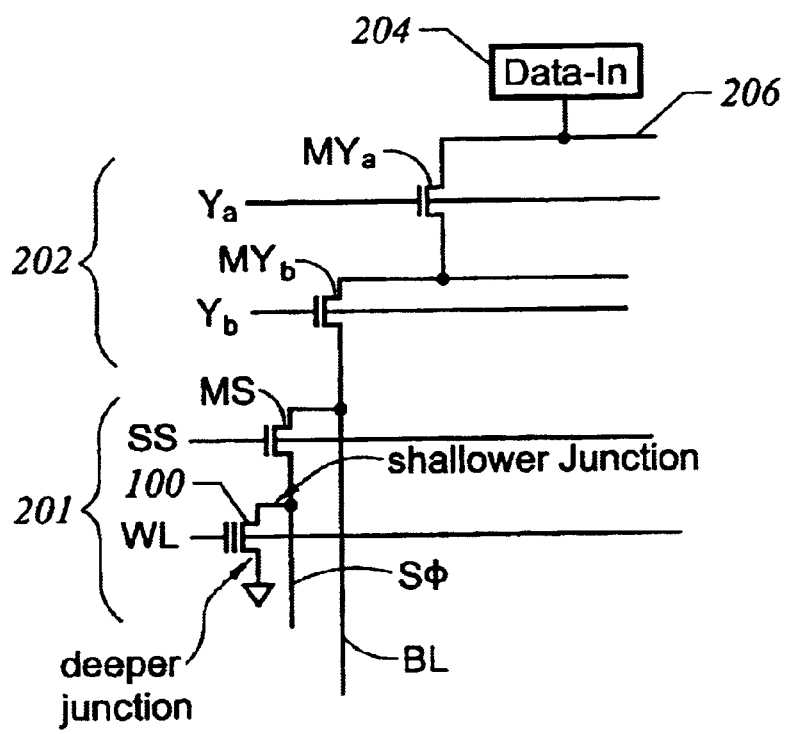
FIG. 2 shows a portion of a memory array along with a portion of a column select circuit of a conventional memory.

In one embodiment, each memory cell in FIG. 4 has a cell structure similar to that shown in FIG. 1, however, contrary to the FIG. 1 cell, junction 103 forms the cell source in the FIG. 4 array, and junction 102 forms the cell drain. The "cell drain" is hereby defined as the cell junction which is connected to the "array line" on which programming and read data are provided. In the FIG. 4 embodiment, the "array line" corresponds to the data lines and their associated segment interconnects. Thus, as indicated for cell Cn in FIG. 4, the deeper junction of the memory cell is coupled to the segment interconnect S0, and thus forms the drain of cell Cn, while the shallower junction is coupled to source line SL0n.

The cell programming is described next using cell C0. In accordance with the invention, cell C0 is programmed, i.e., its threshold voltage is increased, through injection of hot electrons from a pinch-off point in the channel region near the source to the floating gate. In one embodiment, this is achieved by applying a positive voltage to the selected wordline WL00, a negative voltage to the selected segment S0, and grounding source line SL00. In another embodiment, this is achieved by applying a positive voltage to the selected wordline WL00, a ground potential to the selected segment S0, and a positive voltage to source line SL00. In both embodiments, contrary to the conventional approach describe above, the potential on the cell drain is lower than the source, and as such the pinch off point in the channel region occurs near the source rather than the drain.

In one embodiment, cell C0 is programmed in accordance with the biasing indicated in the FIG. 6A table. 5V is applied to the selected wordline WL00, while −5V is applied to all unselected wordlines, −5V is applied to the selected data line DL0 while all unselected data lines float, the selected source line SL00 is grounded while all unselected source lines float, and −5V is applied to the bulk region of the selected sector 0 while all other unselected bulk regions are grounded. Segment select line SS0 is selected (i.e., raised high to, for example, 5V) to transfer the −5V on data line DL0 to segment interconnect S0. All unselected segment select signals are biased to −5V. Further, the selected YA, YB signals are raised high (e.g., 5V) to transfer the −5V provided by voltage source 404 on line 406 to data line DL0. All unselected YA, YB signals are biased to −5V.

Under such biasing, cell C0 will have 10V across its gate to drain, and 5V across its source to drain. Thus, even though very different voltages are applied to the cell terminals than in conventional programming approach, the voltage magnitudes across the cell terminals are similar to those in conventional programming operation.

By applying a negative voltage (e.g., −5V) to the selected segment interconnect rather than the conventional +5V, the transistor drive of the selected segment select transistors MS and the selected column select transistors MY is substantially increased, allowing the sizes of these transistors to be reduced. In the above example, with the selected column decoded signals YA, YB and the selected segment select line SS0 at 5V, and all nodes along the selected column path between line 406 and segment interconnect S0 at −5V, then, the transistor drive of each of MS and MY transistors is roughly equal to Vgs−Vt=Vg−Vs−Vt=+5V−(−5v)−1V=9V. The Vt of transistors MS and MY is 1V because contrary to the prior art approach, the sources of transistors MS and MY are at a negative voltage, which eliminates the threshold voltage degradation present in the prior art approach discussed above. Therefore, with a Vgs−Vt of 9V, as opposed to the mere 3V in the prior art approach, the sizes of MS and MY transistors can be substantially reduced, thus significantly improving the die size.

With both the unselected wordlines and the selected segment interconnect at −5V during programming, there may be an undesirable leakage current through the unselected erased cells coupled to the selected segment interconnect. Such leakage current, in effect, reduce the limited current drive of the charge pump, thus preventing the selected segment interconnect from reaching the target −5V. This results in longer programming time. If any of the above-mentioned unselected erased cells has an erase Vt<0V (e.g., has been over-erased), they would be weakly turned on since their Vgs=Vg−Vs=−5−(−5V)=0V would be greater than their erase Vt, thus, resulting in the leakage current. To eliminate the leakage current, it is necessary to modify the programming voltages indicated in the FIG. 6A table so that the unselected erased cells connected to the selected segment interconnect are turned off even if the they are over-erased. For example, applying −4V rather then −5V to the selected data line provides an over-erase tolerance of down to −1V Vt before the on set of the leakage current. In one embodiment, −5V is applied to the selected data line while −5.25V is applied to the unselected wordlines.

In another embodiment, cell C0 is programmed in accordance with the biasing indicated in the FIG. 6B table. 10V is applied to the selected wordline WL00, while ground potential VSS is applied to all unselected wordlines, VSS is applied to the selected data line DL 0 while all unselected data lines float, 5V is applied to the selected source line SL00 while all unselected source lines float, and VSS is applied to the bulk region of the selected sector 0 and to all other unselected bulk regions. Segment select line SS0 is selected (i.e., raised high to, for example, 5V) to transfer the VSS on data line DL0 to segment interconnect S0. All unselected segment select signals are biased to VSS. Further, the selected YA, YB signals are raised high (e.g., 5V) to transfer the VSS provided by voltage source 404 on line 406 to data line DL0. All unselected YA, YB signals are biased to VSS.

Similar to the programming conditions of FIG. 6A, under the programming biasing of FIG. 6B, cell C0 will have 10V across its gate to drain, and 5V across its source to drain. However, an advantage of the biasing conditions in the FIG. 6B table over that of the FIG. 6A table is that setup time for programming is substantially reduced. As shown in the table of FIG. 6A, during programming, the biasing of the bulk region for the selected memory array and for other transistors (e.g., transistors transferring −5V) need to be changed from 0V to −5V which can take a relatively long time, e.g., greater than 10 uS. But, the biasing of the FIG. 6B table allows the bulk of the selected memory array and other transistors to be biased to 0V, thus substantially reducing the programming setup time, e.g., to about 2 uS.

The sources of the cells along each row are connected together forming a continuous diffusion line extending parallel to the wordlines. To minimize the resistance associated with such diffusion line, each source diffusion line is strapped with metal line. For example, the source diffusion line along the top row of cells is strapped with a metal line, forming source line SL00. The metal line strap contacts the underlying diffusion line a predetermined number of times. In one embodiment, one contact every sixteen cells is used. Even though such strapping reduces the source line resistance, there still remains a finite amount of resistance associated with the sources of the cells. For example, the cell located an equal distance from its two neighboring source contacts has the maximum source resistance, while the cell closest to a source contact has the smallest source resistance.

Figure 3:
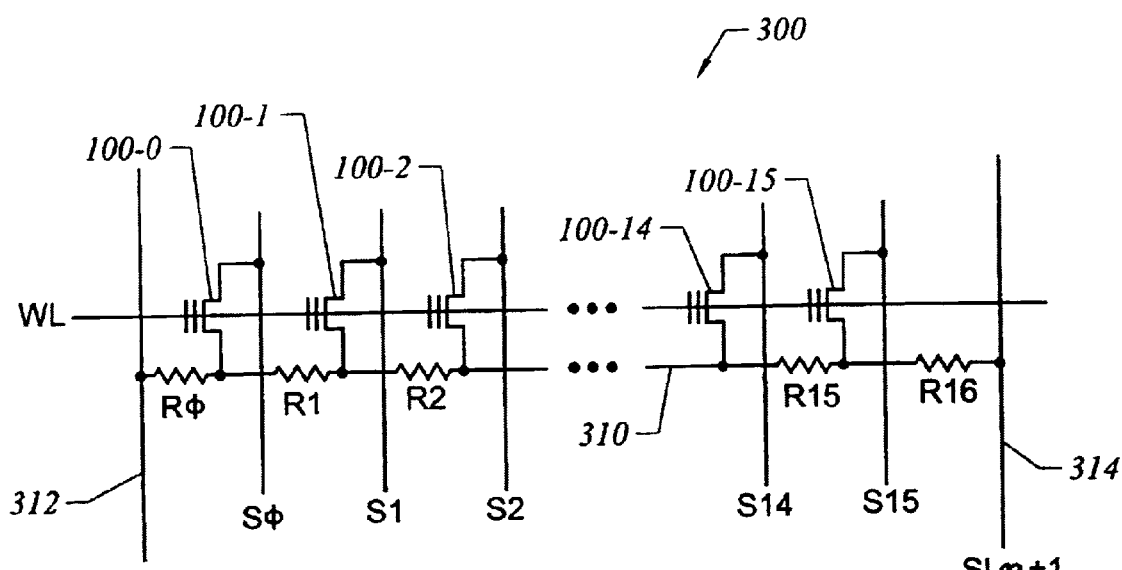
FIG. 3 shows the source connection of a group of cells along a row in a conventional memory array.

Thus, similar to the FIG. 3 array, each cell has a different source resistance depending on its proximity to the metal contact. However, unlike the prior art approach, the varying source resistance of the cells does not result in non-uniform programming characteristics. This is because in FIG. 4 the cell programming performance is primarily determined by the voltage across the gate to drain of each cell, and not the gate to source as in the FIG. 3 approach. Further, because the segment interconnects in FIG. 4 are from metal, no drain resistance variation exists either. Although the source resistance variation causes a variation in the voltage across the drain to source (Vds) of the cells, the impact of the Vds variation on uniformity of the programming characteristics is relatively small.

As indicated in the FIG. 6A table, in a read operation, Vcc (an externally provided supply voltage) is applied to the selected wordline WL, while all unselected wordlines are grounded; the selected data line is biased to 0.7V, while all unselected data lines float; the selected source line is grounded, while all unselected source lines float; and the all sector bulk regions are grounded. Note that Vcc is applied to the selected segment selected transistor and the selected YA and YB transistors, while all other unselected segment select transistors and YA and YB transistors are grounded. For example, cell C0 is read by applying Vcc to wordline WL00 and segment select line SS0, grounding source line SL00, and biasing the data line DL0 to 0.7V prior to sensing to state of cell C0.

In erase operation, cells are erased by electron tunneling from the floating gate to drain. In one embodiment, sector erase is achieved as follows. First, the state of the cells along a selected row in the selected sector are individually verified, and then, only those cells which verified as being programmed are erased. These steps are repeated until all rows of cells in the sleeted sector are erased. As indicated in the FIG. 6A table, to erase a cell verified as being programmed, −10V is applied to the selected wordline, while all unselected wordlines are grounded; 5V is applied to the selected data line, while the unselected data lines float; all source lines float; and all sector bulk regions are grounded. For example, cell C0 is erased by applying −10V to WL00, 5V to data line DL0, grounding the bulk region for sector 0 while all source lines float.

In the FIG. 6A table, the array biasing for two additional operating modes, namely, erase verify (erase VF) and program verify (program VF), are also shown. Program verify mode is entered after each programming cycle to determine if the target programming Vt is obtained. If not, additional programming cycles may be carried out. Similarly, erase verify mode is entered after each erase cycle to determine if the target erase Vt is obtained. If not, additional erase cycles may be carried out. The entries VH1 and VH2 represent verify voltages carefully selected to ensure sufficient programming and erase Vt margins.

Figure 5:
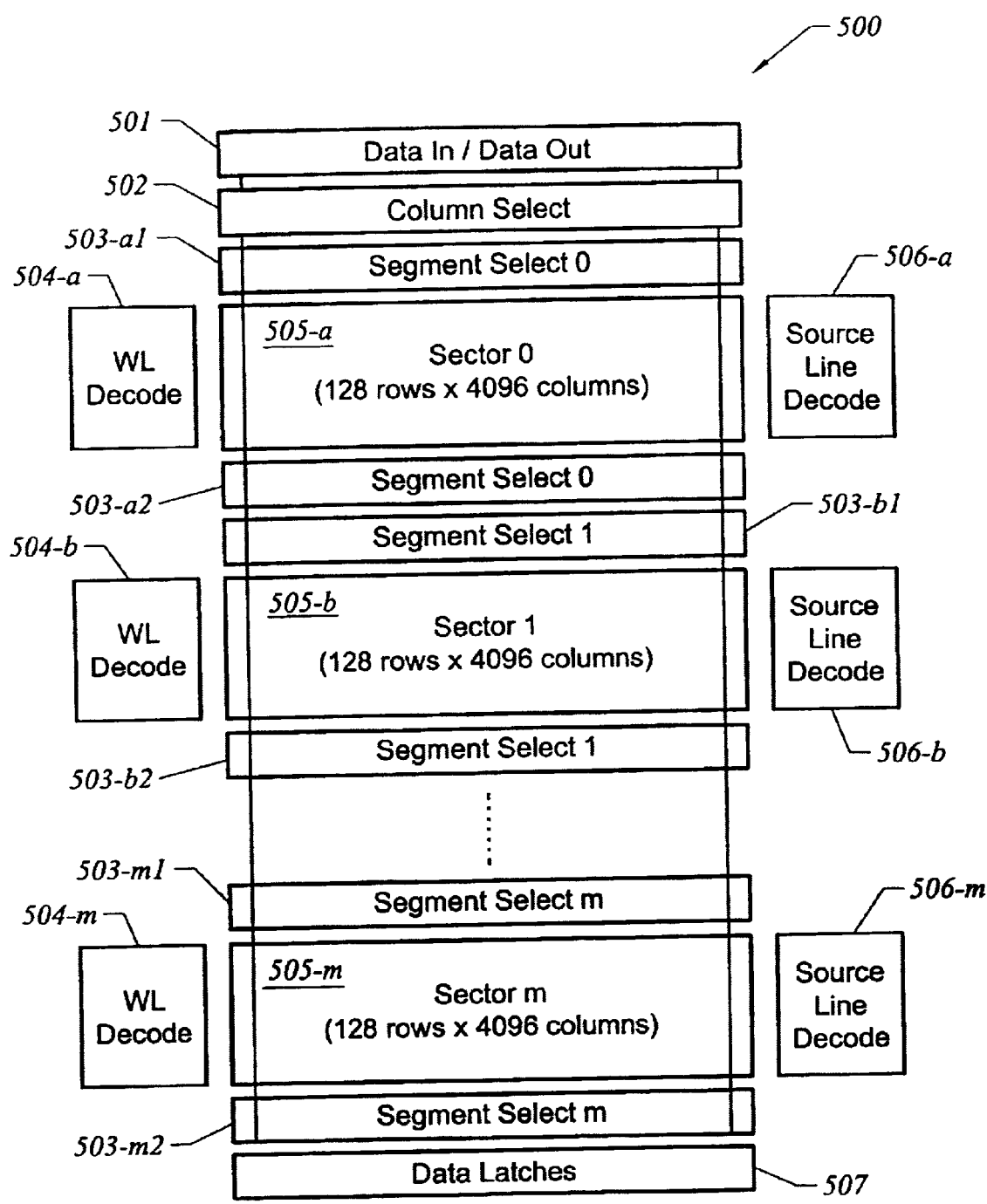
FIG. 5 shows an exemplary floor plan for a memory array and the periphery circuit blocks with which it interfaces.

FIG. 5 shows an exemplary floor plan 500 for a memory array and the periphery circuit blocks with which it interfaces. A total of m array sectors of 128 rows by 4096 columns each are shown. The size of the sectors is merely illustrative and not intended to be limiting. These sectors correspond to the sectors shown in FIG. 4. Each sector interfaces with a first segment select block located along its top side, a second segment select block located along its bottom side, a wordline decode block located along its left side, and source line decode block located along its right side.

As an example, sector 0 interfaces with the segment select 0 blocks 503-a1 and 503-a2 along its top and bottom sides, respectively. In the FIG. 5 embodiment, the segment select transistors coupled to segment select line SS0 (FIG. 4) are divided equally between the two blocks 503-a1 and 503-a2. The segment select transistors in block 503-a are connected to every other segment interconnect in sector 0, while the segment select transistors in block 503-a2 are connected to the alternate segment interconnects. The gates of the segment select transistors in both blocks 503-a1 and 504-a2 are connected to segment select signal SS0 (FIG. 4).

In an alternate embodiment, only one segment select block is provided for each sector, and thus all segment select transistors are provided in the same segment select block. In this embodiment, blocks 503-a2, 503-b2, and 503-m2 in FIG. 5 are eliminated.

The wordline decode blocks 504-a to 504-m and the source line decode blocks 506-a to 506-m collectively operate to select one wordline and a corresponding source line in one of the sectors during each of programming and read operations. In an erase operation, the wordline decode blocks select one row, however, no source line selection takes place since all source lines float during erase. The column select block 502 corresponds to the column select 402 of FIG. 4, and operates to select one data line during each of programming, read, and erase operations. Note that in FIG. 5, the data lines (not shown) run across all the sectors, similarly to data lines in FIG. 4.

The data in/data out block 501 includes sense amplifiers and output buffers (not shown) for a read operation, and data-in buffers for a write operation. Data latches block 507 includes one latch for each data line. These latches are used during an erase operation to store the state of the cells in the selected row. These latches are used in identifying which cells along the selected row do not need to be erased, i.e., were previously erased.

The biasing voltages indicated in FIGS. 6A and 6B tables are illustrative only and not intended to be limiting. These biasing voltages can be altered depending on the design, device, and process requirements.

Figure 7:
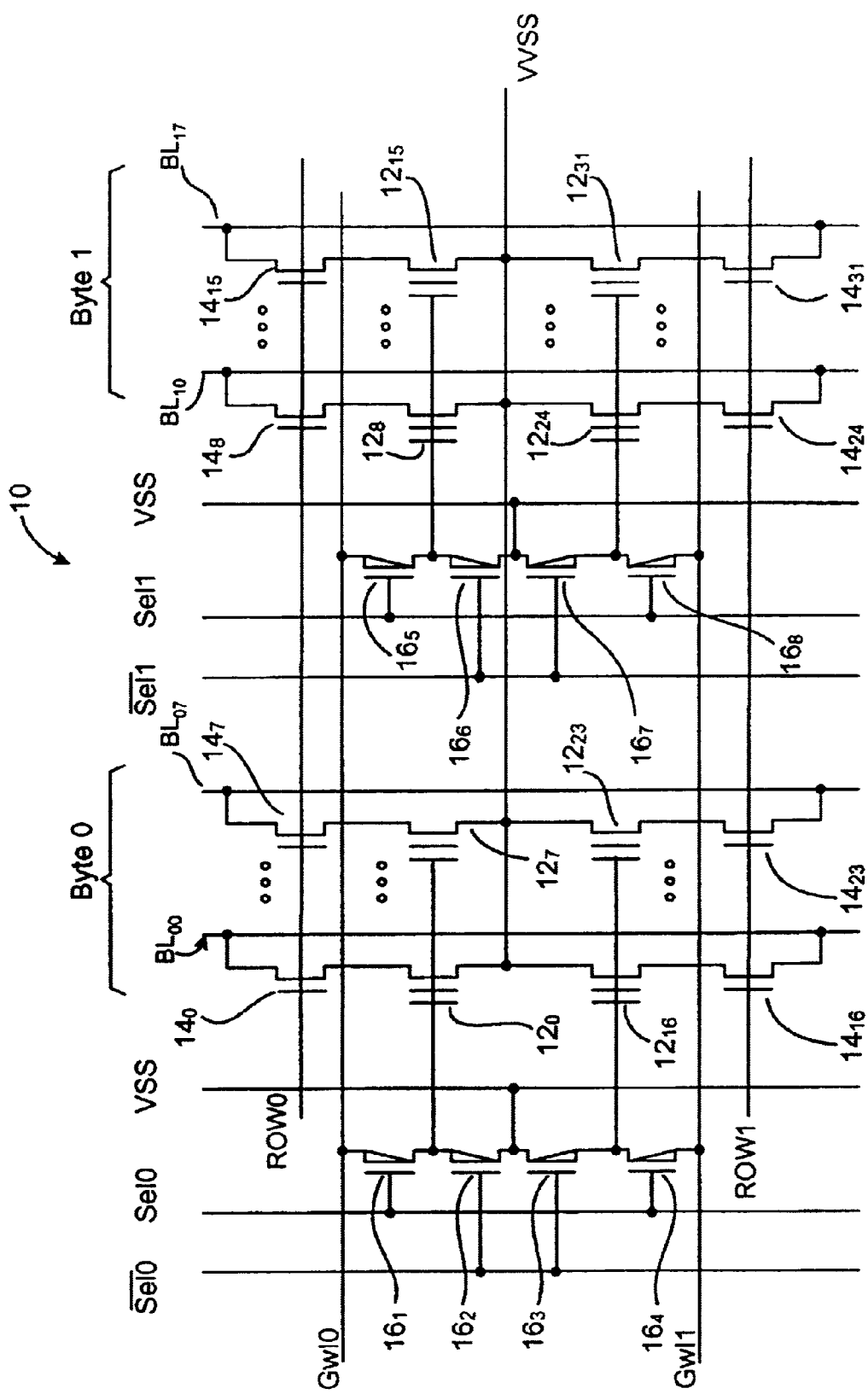
FIG. 7 shows a transistor schematic diagram of a section of an EEPROM array, in accordance with one embodiment of the present disclosure.

FIG. 7 shows a transistor schematic diagram of a section 10 of an EEPROM array in accordance with one embodiment of the present disclosure. A multiplicity of memory cells 12, are arranged in two rows and sixteen columns in array section 10. The structure of memory cell 12, is similar to that used in the array shown in FIG. 4. The sixteen columns are arranged in two groups of eight columns, one group being designated as byte 0 and the other as byte 1. Only two columns in each byte are shown for simplicity.

Arranging the columns of cells in groups of eight (bytes) is illustrative only, and other arrangements such as groups of sixteen (words) are also possible. For example, depending on the I/O bit configuration of the memory device (e.g., by 4, or by 8, or by 16, or by 32), the columns of cells may be arranged in corresponding groups (e.g., 8 columns, or 16 columns, or 32 columns).

In the following, different instances of similar components are identified by similar reference numerals having different indices which appear as subscripts to the identifying reference numerals. For example, the eight shown instances of programmable memory cells are labeled as $12_0$, $12_7$, $12_8$, $12_{15}$, $12_{16}$, $12_{23}$, $12_{24}$ and $12_{31}$. Each bitline in FIG. 1 is identified by letters BL each having a two-digit index appearing as a subscript thereto. The first digit of the index indicate the byte number in which the bitline is disposed, and the second digit of the index indicates the bit position within the byte in which the bitline is disposed. For example, bitline $BL_{00}$ refers to bitline 0 in byte number 0, and bitline $BL_{17}$, refers to bitline 7 in byte number 1. As shown, memory cells $12_0$ and $12_7$ respectively form bits 0 and 7 of byte 0 in the top row, memory cells $12_{16}$ and $12_{23}$ respectively form bits 0 and 7 of byte 0 in the bottom row, memory cells $12_8$ and $12_{15}$ respectively form bits 0 and 7 of byte 1 in the top row, and memory cells $12_{16}$ and $12_{24}$ respectively form bits 0 and 7 of byte 1 in the bottom row.

Each memory cell $12_i$ has a dedicated NMOS select transistor $14_i$ for coupling cell $12_i$ to the cell's associated bit line $BL_{ij}$. For example, cell $12_0$ is coupled to bitline $BL_{00}$ via select transistor $14_0$; cell $12_{15}$ is coupled to bitline $BL_{17}$ via select transistor $14_{15}$. As shown, the gate, drain, and source terminals of each select transistor $14_i$ are respectively coupled to a wordline, a bitline and to the select transistor's associated cell $12_i$. For example, the gate, drain, and source terminals of transistor $14_0$ are respectively coupled to wordline ROW0, bitline $BL_{00}$, and to the drain terminal of cell $12_0$.

The source terminals of all cells $12_i$ disposed in each pair of adjacent rows are coupled together and to the same supply voltage line VVSS. Therefore, all memory cells along the two adjacent rows shown in FIG. 1 have their source terminals connected together and to the same VVSS line.

Associated with each group of cells in a data byte is a pair of PMOS byte-select transistors for coupling the gate terminals of the cells in the data byte to either a signal line Gwli or a voltage supply line VSS. Eight such byte-select transistors $16_1$ to $16_8$ are shown in FIG. 1. Byte-select transistors $16_1$ and $16_2$ respectively couple the gate terminals of the cells in byte 0 of the to row to signal line Gwl0 and supply line VSS. Byte-select transistors $16_3$ and $16_4$ respectively couple the gate terminals of the cells in byte 0 of the bottom row to Gwl1 and VSS lines. Byte-select transistors $16_5$ and $16_6$ respectively couple the gate terminals of the cells in byte 1 of the top row to Gwl0 and VSS lines. Byte-select transistors $16_7$ and $16_8$ respectively couple the gate terminals of the cells in byte 1 of the bottom row to Gwl1 and VSS lines.

The gate terminals of all byte-select transistors which couple their respective cells in a given data byte to Gwl0 and Gwl1 lines receive the same select signal Seli. For example, byte-select transistors $16_1$ and $16_4$ which couple the gate terminals of their respective cells in byte 0 to Gwl0 and Gwl1 lines receive the same select signal Sel0 at their gate terminals. Similarly, byte-select transistors $16_5$ and $16_8$ which couple the gate terminals of their respective cells in byte 1 to Gwl0 and Gwl1 lines receive the same select signal Sel1 at their gate terminals.

The gate terminals of all byte-select transistors which couple their respective cells in a given data byte to VSS line receive the same complement select signal $\overline{Seli}$. For example, byte-select transistors $16_2$ and $16_3$ which couple the gate terminals of their respective cells in byte 0 to VSS line receive the same complement select signal $\overline{Se10}$ at their gate terminals. Similarly, byte-select transistors $16_6$ and $16_7$ which couple the gate terminals of their respective cells in byte 1 to VSS line receive the same complement select signal $\overline{Se11}$ at their gate terminals.

As described above, the drain junction of the memory cell extends deeper into the bulk region than that of the source junction. Thus, in the FIG. 7 array, the deeper drain junction of each cell is coupled to its corresponding bitline through a select transistor $14_i$, and the shallower source junction of each cell is coupled to a corresponding VVSS line. For example, as shown for cell $12_0$ in FIG. 7, the deeper drain junction of cell $12_0$ is coupled to bitline $BL_{00}$ through select transistor $14_0$, and the shallower source junction of cell $12_0$ is coupled to the VVSS line.

FIG. 8A exemplifies, in a table format, a first set of biasing conditions applied to the array section 10 of FIG. 7 during each of the program, erase, and read operations. The indicated voltage levels are illustrative only and may vary depending on, for example, the process technology, the cell technology, the array configuration, and the like. The row corresponding to "Program" shows the requisite biasing to program one or more of the eight cells of the data byte in byte 0 of the top row in FIG. 7. The row corresponding to "Erase" shows the requisite biasing to erase one or more of the eight cells of the data byte in byte 0 of the top row in FIG. 7. The row corresponding to "Read" shows the requisite biasing to read out the eight cells of the data byte in byte 0 of the top row in FIG. 7. Each of the programming, erase, and read operations is described next using the exemplary biasing conditions shown in table of FIG. 8A.

Each cell $12_i$ is programmed using hot electron injection and erased using Fowler-Nordheim (FN) tunneling, as described above. In accordance with the biasing example shown in FIG. 8A, to program an erased cell $12_i$, 5 volts is applied to the cell's gate terminal, −5 volts is applied to the cell's drain terminal, 0 volts is applied to the cell's source terminal, and −5 volts to the bulk. Assuming, for example, that cell $12_0$ in byte 0 of the top row is initially in an erased state, and that it is desired to program cell $12_0$ of this data byte, the voltages applied to the selected wordline ROW0 is 5 volts and to the selected bitline $BL_{00}$ is −5 volts. All the unselected wordlines, e.g., ROW1, receive −5 volts. Similarly, the selected line Gw10 is set to 5 volts while the unselected supply voltage line Gw11 is set to 0 volts. The voltage applied to supply line VSS is 0 volts, and to line VVSS is 0 volts. The voltages applied to select signals Se10 and Se11 are respectively 0 and 5 volts, and thus the complement select signals $\overline{Se10}$ and $\overline{Se11}$ are at 5 and 0 volts, respectively.

With the above biasing, since the gate and drain terminals of NMOS transistor $14_0$ respectively receive 5 and −5 volts, the drain terminal cell $12_0$ receives the −5 volts applied to $BL_{00}$. With 0 and 5 volts respectively applied to the gate and source terminals of PMOS byte-select transistor $16_1$, the gate terminal of cell $12_0$ receives 5 volts. Also, the bulk region within which the memory cells are located is biased to −5 volts. Thus, the voltages applied to the gate, drain, source, and body terminals of cell $12_0$ are respectively 5, −5, 0, and −5 volts, causing cell $12_0$ to be programmed through injection of hot electrons from its source-side of the channel to its floating gate.

If only bit 0 of byte 0 of the top row (i.e., cell $12_0$) is desired to be programmed, the other bitlines $BL_{01}$ to $BL_{07}$ in byte 0 are not biased (i.e., are allowed to float), and therefore, cells $12_1$ to $12_7$ maintain their previous states. If other cells in the same data byte are desired to be programmed, their corresponding bitlines need to be biased to −5 volts. The gate terminals of the cells in byte 0 of the bottom row are coupled to Gw11 line which receives 0 volts. Accordingly, all cells $12_{16}$ to $12_{23}$ forming the 8 bits of byte 0 in bottom row maintain their previous states. With Se11 and $\overline{Se11}$ lines are respectively biased to 5 volts and 0 volts, the gate terminals of all cells forming byte 1 in each of the top and bottom rows are coupled to VSS line through their respective byte-select transistors $16_6$ and $16_7$, and thus all these cells also maintain their previous states.

In accordance with the biasing example shown in FIG. 8A, to erase a cell $12_i$, its source terminal is caused to float, its bulk region is biased to 0 volts, while −10 volts and 5 volts are respectively applied to the cell's gate and drain terminals. Assuming that the eight cells in byte 0 of the top row are in programmed state, and it is desired to erase only these eight cells, the voltage applied to the selected wordline ROW0 is set to 10 volts while that applied to the unselected wordlines e.g., ROW1, is set to 0 volts. The voltages applied to the selected Gw10 line and the unselected Gw11 line are respectively set to −10 and 0 volts. Supply line VSS receives 0 volts while supply line VVSS is caused to float through a device not shown in FIG. 7. Select signals Se10 and Se11 are respectively set to −10 and 0 volts thereby causing signals $\overline{Se10}$ and $\overline{Se11}$ to be at 0 and −10 volts, respectively. Since it is desired to erase all eight cells in byte 0 of the top row, the voltage of all bitlines $BL_{00}$ to $BL_{07}$ are set to 5 volts while that of all the other bitlines in the array are set to 0 volts. If fewer than the eight bits in the data byte are desired to be erased, the bitlines corresponding to the cells not to be erased are set to 0 volts.

With the above erase biasing conditions, the drain and gate terminals of the eight cells selected for erase receive 5 and −10 volts respectively, the bulk region is biased to 0 volts, while the source terminals of the eight cells float. This causes all eight cells to be erased simultaneously through tunneling of electrons from the cells' floating gate to their drain terminals. Except for the selected eight cells in byte 0 of the top row, none of the other cells in the array experience the voltage conditions required for the erase operation and therefore maintain their previous states.

In accordance with the biasing example shown in FIG. 8A, to read a cell $12_i$, 3 volts is applied to the cell's gate terminal, 1 volts is applied to cell's drain terminal, the cell's source terminal is grounded, and the bulk region is biased to 0 volts. Assuming, for example, data byte 0 in the top row is to be read, wordlines ROW0 and ROW1 are respectively set to 3 and 0 volts, both Gw10 and Gw11 are set to 3 volts, and supply lines VSS and VVSS are both set to 0 volts. Select signals Se10 and Se11 are respectively set to 0 and 3 volts thereby causing signals $\overline{Se10}$ and $\overline{Se11}$ to be at 3 and 0 volts, respectively. Accordingly, the gate terminals of all cells $12_0$ to $12_7$ in byte 0 of the top row receive 3 volts, while those in all other data bytes receive 0 volts. Bitlines $BL_{00}$ to $BL_{07}$ in byte 0 of the top row receive 1 volts, and because select transistors $14_0$ and $14_7$ are on, the drain terminals of cells $12_0$ to $12_7$ in byte 0 receive 1 volts. With the gate, drain, and source terminals of cells $12_0$ to $12_7$ biased to 3 volts, 1 volts, and 0 volts respectively, the states of these cells are read. To the extent that none of the cells except for those in byte 0 of the top row receive the read biasing voltages, they are not read.

FIG. 8B, in a table format, a second set of biasing conditions applied to the array section 10 of FIG. 7 during each of the program, erase, and read operations. The biasing for read and erase operations are the same as in the table of FIG. 8A. The biasing for program operation however is different. As for the FIG. 8A table, the indicated voltage levels in the FIG. 8B table are illustrative only and may vary depending on, for example, the process technology, the cell technology, the array configuration, and the like. The row corresponding to "Program" shows the requisite biasing to program one or more of the eight cells of the data byte in byte 0 of the top row in FIG. 7.

In accordance with the biasing example shown in FIG. 8B, to program an erased cell $12_i$, 10 volts is applied to the cell's gate terminal, 0 volts is applied to the cell's drain terminal, 5 volts is applied to the cell's source terminal, and 0 volts to the bulk region. Assuming, for example, that cell $12_0$ in byte 0 of the top row is initially in an erased state, and that it is desired to program cell $12_0$ of this data byte, the voltages applied to the selected wordline ROW0 is 10 volts and to the selected bitline $BL_{00}$ is 0 volts. All the unselected wordlines, e.g., ROW1, receive 0 volts. Similarly, the selected line Gw10 is set to 10 volts while the unselected supply voltage line Gw11 is set to 0 volts. The voltage applied to supply line VSS is 0 volts, and to line VVSS is 5 volts. The voltages applied to select signals Se10 and Se11 are respectively 0 and 5 volts, and thus the complement select signals $\overline{Se10}$ and $\overline{Se11}$ are at 5 and 0 volts, respectively.

With the above biasing, since the gate and drain terminals of NMOS transistor $14_0$ respectively receive 10 and 0 volts, the drain terminal of cell $12_0$ receives the 0 volts applied to $BL_{00}$. With 0 and 10 volts respectively applied to the gate and source terminals of PMOS byte-select transistor $16_1$, the gate terminal of cell $12_0$ receives 5(10) volts. Also, the bulk region within which the memory cells are located is biased to 0 volts. Thus, the voltages applied to the gate, drain, source, and body terminals of cell $12_0$ are respectively 10, 0, 5, and 0 volts, causing cell $12_0$ to be programmed through injection of hot electrons from its source-side of the channel to its floating gate.

If only bit 0 of byte 0 of the top row (i.e., cell $12_0$) is desired to be programmed, the other bitlines $BL_{01}$ to $BL_{07}$ in byte 0 are not biased (i.e., are allowed to float), and therefore, cells $12_1$ to $12_7$ maintain their previous states. If other cells in the same data byte are desired to be programmed, their corresponding bitlines need to be biased to 0 volts. The gate terminals of the cells in byte 0 of the bottom row are coupled to Gw11 line which receives 0 volts. Accordingly, all cells $12_{16}$ to $12_{23}$ forming the 8 bits of byte 0 in bottom row maintain their previous states. With Se11 and $\overline{Se11}$ lines are respectively biased to 5 volts and 0 volts, the gate terminals of all cells forming byte 1 in each of the top and bottom rows are coupled to VSS line through their respective byte-select transistors $16_6$ and $16_7$, and thus all these cells also maintain their previous states.

An advantage of the biasing conditions in the FIG. 8B table over that of the FIG. 8A table is that setup time for programming is substantially reduced. As shown in the table of FIG. 8A, during programming, the biasing of the bulk region for the selected memory array and for other transistors (e.g., transistors transferring −5V) need to be changed from 0V to −5V which can take a relatively long time, e.g., greater than 10 uS. But, the biasing of the FIG. 8B table allows the bulk of the selected memory array and other transistors to be biased to 0V, thus substantially reducing the programming setup time, e.g., to about 2 uS.

Figure 9:
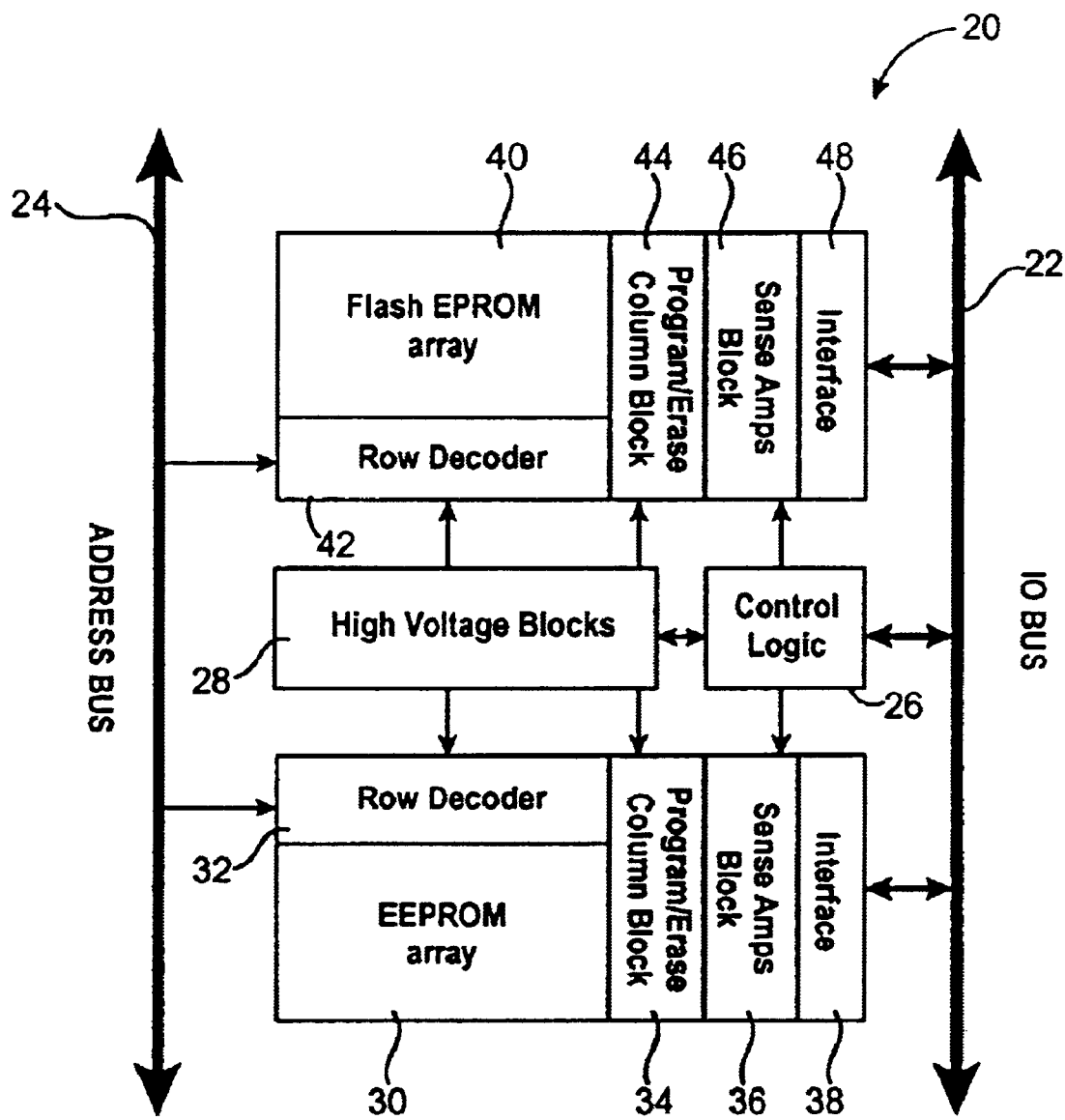
FIG. 9 shows some of the circuit blocks that are included in an integrated circuit memory containing both an EEPROM array and a flash EPROM array, in accordance with one embodiment of the present disclosure.

FIG. 9 shows a simplified block diagram of an integrated circuit memory device 20, which includes both an EEPROM array 30 and a flash EPROM array 40, in accordance with one embodiment of the present invention. The same cell is advantageously used to form both the EEPROM array 30 (details of which are shown in FIG. 7 and described above) and the flash EPROM array 40 (details of which are shown in FIG. 4). Because both the EEPROM and flash EPROM arrays are formed using the same cells, the voltages applied to both arrays during program, erase, and read are substantially the same.

In FIG. 9, externally provided address signals are transferred to row decoders 32 and 42 and column decoders (not shown) of the respective arrays 30 and 40 via an address bus 24. Row decoders 32 and 42 and column decoders not shown respectively decode the addressed location within arrays 30 and 40. A high voltage blocks 28 supplies high voltage signals to both arrays 30 and 40 as well as other logic circuits for programming and erase operations (and read operation if voltages greater than the externally provided supply voltage are needed during read). A control logic block 26 provides control signals to both arrays 30 and 40 during programming, read, and erase operations. A program/erase column block 44, sense amplifier block 46, and interface block 48 are provided for interface with array 40. Similarly, a program/erase column block 34, sense amplifier block 36, and interface block 38 are provided for interface with array 30. Data IO bus 22 is coupled to both interface blocks 38 and 48 to enable transfer of data to and from the two memory arrays.

Integrated circuit memory 20 can be designed to operate in a number of ways. For example, by providing each of the two memory arrays 30 and 40 its dedicated address and data bus, and duplicating some of the internal circuitry, the two memory arrays 30 and 40 can be accessed simultaneously. This allows the flash EPROM array to be accessed, for example, to carry out a read operation at the same time that the EEPROM array is accessed to carry out, for example, a programming operation. As can be seen, such flexible design enables the two memory arrays to be accessed simultaneously to carry out any combination of read, programming, and erase operations. Alternatively, memory IC 20 can be designed so that only one of the two memory arrays 30 and 40 can be accessed at any one time. This helps reduce the total die size by allowing circuit blocks to be shared between the two arrays. This design may be suited for applications where lower device cost is of greater importance while the functional flexibility is not as critical.

Thus, the memory cell and the corresponding flash EPROM array of FIG. 4 and EEPROM array of FIG. 7 allow combining flash EPROM functionality along with EEPROM functionality on the same IC such that each of the flash EPROM and the EEPROM portions of the IC are capable of functioning in accordance with conventional standards (e.g., the EEPROM can be erased byte-by-byte or word-by-word, while the flash EPROM can be erased sector-by-sector). Both arrays are formed using the same memory cell which is programmed from the source-side of the cell using hot-electron injection and is erased from the drain-side of the cell using Fowler-Nordheim tunneling.

The exemplary embodiments of the present disclosure are illustrative and not limiting. The invention is not limited by the number of rows and columns of memory cells 12i forming the memory array. The invention is not limited by the type of select transistor or byte-select transistor that is disposed in array section 10. The invention is not limited to the number of bits that are included in each group of data columns. For example, each data group may include 16 or 32 cells to thereby form a memory which is 16-bits or 32-bits wide. Nor is the invention limited by the level of voltages that are applied to a memory array during each of the program/erase/read operations. Other variations of the invention are obvious in light of this disclosure and are intended to fall within the scope of the appended claims.

What is claimed is:

1. A non-volatile integrated memory comprising:
    a flash EPROM array having a first plurality of memory cells; and
    an EEPROM array having a second plurality of memory cells arranged along rows and columns, wherein each of the first and second plurality of memory cells has a drain region spaced apart from a source region to form a channel region therebetween, the drain region having a greater depth than the source region, each memory cell further having a floating gate and a select gate, the EEPROM array further comprising:
        a plurality of data lines each being coupled to the drain regions of a plurality of cells along at least a portion of a column of cells; and
        a plurality of source lines each being coupled to the source regions of a plurality of cells along at least a portion of a row of cells.

2. The integrated circuit memory of claim 1, wherein a drain region of each memory cell in the EEPROM array is coupled to a corresponding dataline disposed within the EEPROM array through an associated drain-select transistor.

3. The integrated circuit memory of claim 2 wherein the memory cells along a row in the EEPROM array are divided into a predesignated number of groups, the gate terminals of memory cells in each group being connected together and to first and second signal lines through an associated pair of first and second group-select transistors.

4. The integrated circuit memory of claim 3 wherein the source region of each memory cell disposed along a row of the EEPROM array is coupled to a third signal line.

5. The integrated circuit memory of claim 3 wherein the source region of each of the memory cells disposed along two adjacent rows of the EEPROM array is coupled to a third signal line.

6. The integrated circuit memory of claim 3 wherein gate terminals of each pair of first and second group-select transistors associated with each of the predesignated number of groups of memory cells along the row are configured to receive a different pair of select signals.

7. The integrated circuit memory of claim 3 wherein one of drain and source regions of each of the second group-select transistors associated with each of the predesignated number of groups of memory cells along the row in the EEPROM array are connected together to form a first wordline extending parallel to the row, the wordline being one of the first and second signal lines, and a gate of each drain-select transistor associated with each cell along the row being connected together to form a second wordline extending parallel to the row.

8. The integrated circuit memory of claim 1 wherein one or more of the first and second plurality of memory cells are biased so that a threshold voltage of the one or more biased memory cells are decreased by fowler nordheim tunneling of electrons from the floating gate to the drain region.

9. The integrated circuit memory of claim 1 wherein one or more of the first and second plurality of memory cells are biased so that a threshold voltage of the one or more biased memory cells is increased by channel hot electron injection from a portion of the channel region substantially near the source region to the floating gate.

10. The integrated circuit memory of claim 9 wherein said threshold voltage of the one or more biased memory cells is increased by applying a first negative voltage to a selected data line to which the drain of the selected memory cell is coupled, a second positive voltage to a word line to which the selected gate of the selected memory cell is coupled, and a third voltage to a source line to which the source of the selected memory cell is coupled, wherein said injection of hot electrons increases a threshold voltage of the selected cell.

11. The integrated circuit memory of claim 10 wherein the source and drain regions of the first and second plurality of memory cells are in a bulk region biased to a fourth negative voltage.

12. The integrated circuit memory of claim 11 wherein the first negative voltage is in the range of −4V to −6V, the second positive voltage is in the range of 4V to 6V, the third voltage is in the range of −1V to 1V, and the fourth negative voltage is in the range of −4V to −6V.

13. The integrated circuit memory of claim 1 wherein the memory cells along one of the rows in the EEPROM array is divided into a predesignated number of groups of cells, the memory cells in each group having their gate terminals connected together to form a gate-line, the EEPROM array further comprising:
    a plurality of group-select transistors arranged along the rows and columns, one of a drain and source terminals of each of the group-select transistors along said one of the rows being connected to a different one of the gate-lines of the groups of cells along said one of the rows, and the other one of the drain and source terminals of each of the group-select transistors along said one of the rows being connected together to form a global wordline extending parallel to the rows.

14. The integrated circuit memory of claim 13 herein gate terminals of the group-select transistors along each of the columns are connected together to form a first plurality of select lines, wherein during a memory operation a first plurality of select signals are provided on the first plurality of select lines to select one of the predesignated number of groups of cells along a preselected row of cells in the EEPROM array.

15. The integrated circuit memory of claim 13 herein each of the second plurality of memory cells is coupled to a corresponding bitline through an associated bitline select transistor, wherein gate terminals of the bitline select transistors along each row of cells are connected together to form a first plurality of wordlines extending parallel to the rows of cells in the EEPROM array.

16. The integrated circuit memory of claim 1 wherein injection of hot electrons from a portion of the channel region near the source region to the floating gate is induced in a selected memory cell in the EEPROM array by applying a first negative voltage to a selected data line to which the drain of the selected memory cell is coupled, a second positive voltage to a word line to which the selected gate of the selected memory cell is coupled, and a third voltage to a source line to which the source of the selected memory cell is coupled, wherein said injection of hot electrons increases a threshold voltage of the selected cell.

17. The integrated circuit memory of claim 16 wherein the source and drain regions of the first and second plurality of memory cells are in a bulk region biased to a fourth negative voltage.

18. The integrated circuit memory of claim 17 wherein the first negative voltage is in the range of −4V to −6V, the second positive voltage is in the range of 4V to 6V, the third voltage is in the range of −1V to 1V, and the fourth negative voltage is in the range of −4V to −6V.

19. The integrated circuit memory of claim 1 wherein injection of hot electrons from a portion of the channel region near the source region to the floating gate is induced in a selected memory cell in the EEPROM array by applying a first voltage to a selected data line to which the drain of the selected memory cell is coupled, a second positive voltage to a word line to which the selected gate of the selected memory cell is coupled, and a third positive voltage to a source line to which the source of the selected memory cell is coupled, wherein said injection of hot electrons increases a threshold voltage of the selected cell.

20. The integrated circuit memory of claim 19 wherein the source and drain regions of the first and second plurality of memory cells are in a bulk region biased to a fourth voltage.

21. The integrated circuit memory of claim 20 wherein the first voltage is in the range of −1V to 1V, the second positive voltage is in the range of 9V to 11V, the third positive voltage is in the range of 4V to 6V, and the fourth voltage is in the range of −1V to 1V.

22. A non-volatile integrated memory comprising:
a flash EPROM array having a first plurality of memory cells; and
an EEPROM array having a second plurality of memory cells arranged along rows and columns, the EEPROM array further comprising:
a plurality of data lines each being coupled to a drain region of a plurality of cells along at least a portion of a column of cells; and
a plurality of source lines each being coupled to a source region of a plurality of cells along at least a portion of a row of cells, each memory cell having a gate terminal, a floating gate, and a channel region between its source and drain regions,
wherein one or more of the first and second plurality of memory cells are biased so that a threshold voltage of the one or more biased memory cells is increased by channel hot electron injection from a portion of the channel region substantially near the source region to the floating gate.

23. The non-volatile integrated memory of claim 22 wherein one or more of the first and second plurality of memory cells are biased so that a threshold voltage of the one or more biased memory cells are decreased by fowler nordheim tunneling of electrons from the floating gate to the drain region.

24. The integrated circuit memory of claim 22, wherein a drain region of each memory cell in the EEPROM array is coupled to a corresponding dataline disposed within the EEPROM array through an associated drain-select transistor.

25. The integrated circuit memory of claim 24 wherein the memory cells along a row in the EEPROM array are divided into a predesignated number of groups, the gate terminals of memory cells in each group being connected together and to first and second signal lines through an associated pair of first and second group-select transistors.

26. The integrated circuit memory of claim 25 wherein the source region of each memory cell disposed along a row of the EEPROM array is coupled to a third signal line.

27. The integrated circuit memory of claim 25 wherein the source region of each of the memory cells disposed along two adjacent rows of the EEPROM array is coupled to a third signal line.

28. The integrated circuit memory of claim 25 wherein gate terminals of each pair of first and second group-select transistors associated with each of the predesignated number of groups of memory cells along the row are configured to receive a different pair of select signals.

29. The integrated circuit memory of claim 25 wherein one of drain and source terminals of each of the second group-select transistors associated with each of the predesignated number of groups of memory cells along the row in the EEPROM array are connected together to form a first wordline extending parallel to the row, the wordline being one of the first and second signal lines, and a gate of each drain-select transistor associated with each cell along the row being connected together to form a second wordline extending parallel to the row.

30. The integrated circuit memory of claim 22 wherein said threshold voltage of the one or more biased memory cells is increased by applying a first voltage to a selected data line to which the drain of the selected memory cell is coupled, a second positive voltage to a word line to which the selected gate of the selected memory cell is coupled, and a third positive voltage to a source line to which the source of the selected memory cell is coupled, wherein said injection of hot electrons increases a threshold voltage of the selected cell.

31. The integrated circuit memory of claim 30 wherein the source and drain regions of the first and second plurality of memory cells are in a bulk region biased to a fourth voltage.

32. The integrated circuit memory of claim 31 wherein the first voltage is in the range of −1V to 1V, the second positive voltage is in the range of 9V to 11V, the third positive voltage is in the range of 4V to 6V, and the fourth voltage is in the range of −1V to 1V.

33. A method of operating a non-volatile integrated circuit memory having an EEPROM array and a flash EPROM array, the method comprising:
accessing a memory cell in the EEPROM array having a plurality of memory cells arranged along rows and columns, each memory cell having a drain region, a source region, a gate terminal, a floating gate, and a channel region between its source and drain regions, the EEPROM array further having a plurality of data lines each being coupled to a drain region of each of a plurality of memory cells along a column, and a plurality of source lines each being coupled to a source region of each of a plurality of memory cells along a row; and
providing a voltage representing the data to be programmed in the accessed memory cell on a preselected data line coupled to the accessed cell, wherein a threshold voltage of the accessed memory cell is increased by injection of hot electrons from a portion of the selected cell's channel region substantially near the source region to the accessed cell's floating gate.

34. The method of claim 33 wherein the accessing act further comprises selectively coupling a drain region of each memory cell in the EEPROM array to a corresponding one of a plurality of bitlines disposed within the EEPROM array through an associated drain-select transistor.

35. The method of claim 33 wherein the memory cells along a row in the EEPROM array are divided into a predesignated number of groups, the memory cells in each group having their gate terminals connected together, the accessing act further comprising selectively coupling the gate terminals of the memory cells in each group along the row to a first and a second signal line through a pair of first and second group-select transistors associated with each group.

36. The method of claim 35 wherein the selectively coupling act further comprises applying a different one of a plurality of pairs of select signals to gate terminals of each pair of the first and second group-select transistors along the row of the EEPROM array for selecting one or more of the groups of memory cells.

* * * * *